United States Patent [19]

Ikeda et al.

[11] 4,243,506
[45] Jan. 6, 1981

[54] PLASMA-ETCHING APPARATUS

[75] Inventors: Kiyoji Ikeda, Hachioji; Tetsuya Hayashida, Hinodemachi, both of Japan

[73] Assignee: Hitachi, Ltd., Japan

[21] Appl. No.: 69,058

[22] Filed: Aug. 23, 1979

[30] Foreign Application Priority Data

Aug. 28, 1978 [JP] Japan .................. 53-103942

[51] Int. Cl.³ .............................. B01K 1/00
[52] U.S. Cl. .................. 204/298; 156/345; 156/643; 204/192 E; 250/531
[58] Field of Search ............ 204/192 E, 298; 156/345, 643; 250/531

[56] References Cited

U.S. PATENT DOCUMENTS

| | | | |
|---|---|---|---|
| 4,123,316 | 10/1978 | Tsuchimoto | 156/643 |
| 4,123,663 | 10/1978 | Horiike | 250/531 |
| 4,158,589 | 6/1979 | Keller et al. | 156/345 |

OTHER PUBLICATIONS

T. O. Herndon et al., "Plasma Etching of Aluminum", Kodak Microelectronics Seminar Proceedings (1977), pp. 33-41.

S. M. Irving et al., "Localized Plasma Etching of Dielectric & Silicon Films", Kodak Microelectronics Seminar Proceedings (1977), pp. 55-65.

Primary Examiner—Aaron Weisstuch
Attorney, Agent, or Firm—Craig & Antonelli

[57] ABSTRACT

A "planar" type plasma-etching apparatus wherein one electrode is a metallic mesh electrode, while the other electrode is a metallic plate electrode, and wherein a work piece is placed outside the mesh electrode. This apparatus has the advantage that a work piece having a large area can be etched uniformly over its whole surface.

10 Claims, 5 Drawing Figures

PLASMA-ETCHING APPARATUS

BACKGROUND OF THE INVENTION

1. Field of the Invention

This invention relates to plasma-etching apparatus, and more particularly to a plasma etching apparatus which can etch the surface of a work piece uniformly over its entire area.

2. Description of the Prior Art

As is well known, the term "plasma etching" signifies a process wherein, e.g., a halide such as $CF_4$, $CCl_4$, and $BCl_3$ or a gas such as $O_2$, $N_2$, Ar, and air is introduced into a reaction tube to establish a predetermined pressure, radio-frequency power is applied across electrodes to generate a plasma, and the surface of a work piece placed in the reaction tube is etched by radicals produced by the plasma.

Equipment for use in such plasma etching is classified into the induction coil type and the capacitance type on the basis of the configurations of the electrodes for generating the plasma. The structure of a typical plasma etching apparatus of the capacitance type in the prior art is shown in FIG. 1. This apparatus is also called the "barrel" type. Semi-annular electrodes 1 and 2 are opposingly arranged on the outer wall of a reaction tube 4 with a desired gas introduced therein, and are respectively connected to a radio-frequency power source. A work piece 3 to be etched is placed substantially in the central part of the interior of the reaction tube 4.

With the prior art apparatus having the electrodes of such shape, in the case where $CF_4$, $O_2$, $N_2$, Ar, air or the like is employed as the gas to be introduced into the reaction tube, the plasma is comparatively homogeneously distributed in the reaction tube, so that the etching proceeds substantially uniformly without a very serious hindrance in practical use. However, when it is intended to perform the etching by introducing a gas containing chlorine, such as $CCl_4$ and $BCl_3$, the plasma forms only in regions where the radio-frequency potential is high. Therefore, the etching of the work piece placed in the reaction tube becomes non-uniform.

In order to solve this problem, there has been proposed a plasma-etching apparatus of the structure shown in FIG. 2. As apparent from the figure, this apparatus is constructed such that electrodes 11 and 12 formed as two parallel plates are disposed within a reaction tube 4 and a work piece 3 is situated between the parallel plate electrodes 11 and 12. This construction is sometimes called the "planar" type.

The plasma-etching equipment employing the parallel plate electrodes can generate homogeneous plasma across the electrodes 11 and 12 even when the etching is carried out by introducing a gas containing chlorine, such as $CCl_4$ and $BCl_3$. However, in the case where the work piece 3 is made of an insulator or where although the work piece is made of a conductor it is insulated from the electrodes, the plasma becomes inhomogeneous in such a manner that the intensity is higher in the peripheral part than the central part of the work piece. For this reason, especially the edge part of the work piece and the vicinity thereof is conspicuously etched as compared with the central part, and it is impossible to uniformly etch the whole surface of the work piece.

It has accordingly been difficult to manufacture by the plasma-etching process any component requiring etching of particularly high precision, for example, a photomask substrate for fabricating a semiconductor device.

The plasma-etching equipment of the "barrel" type and the "planar" type have been extensively used, and are described in many publications, for example, Kodak Microelectronics Seminar Proceedings, Interface '77, pages 55-65.

In order to reduce the non-uniformity of the etching, there has been proposed a method wherein a planar-type apparatus is employed, and the etching is executed while rotating an electrode on which a work piece is put (Kodak Microelectronics Seminar Proceedings, Interface '77, pages 33-41). However, it has been difficult with such prior art equipment and methods to achieve a uniform etching satisfactory in practical use, and superior plasma-etching apparatus and method has been desired.

SUMMARY OF THE INVENTION

An object of this invention is to solve the problems of the prior art plasma-etching equipment described above and to provide a plasma-etching apparatus which can expose the surface of a work piece to a plasma having a homogeneous distribution, so as to etch the whole surface uniformly.

In order to accomplish this object, this invention consists in employing a mesh electrode as one of two parallel plate electrodes in a planar-type apparatus and locating the work piece outside the mesh electrode.

DETAILED DESCRIPTION OF THE PREFERRED EMBODIMENTS

Figure 3:
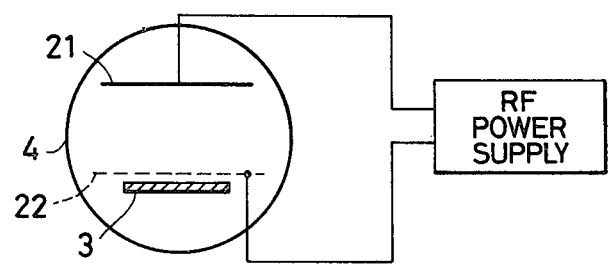
FIG. 3 is a schematic diagram showing the structure of a plasma-etching apparatus according to this invention.

FIG. 3 is a view showing the construction of this invention. A metallic plate electrode 21 and a metallic mesh electrode 22 are arranged inside a reaction tube 4 in parallel and in opposition to each other, and they are respectively connected to a radio-frequency power source. As shown in FIG. 3, a work piece 3 is placed outside the mesh electrode 22 on a support (not shown).

Figure 4:
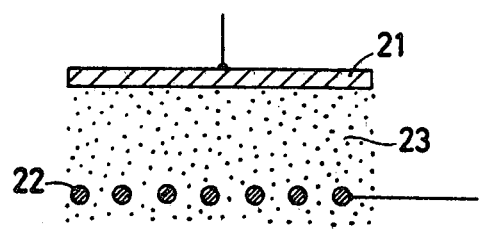
FIG. 4 is a diagram for explaining the state of plasma generated in this invention.

When a predetermined gas is introduced into the reaction tube 4 at a predetermined pressure and radio-frequency power (at a frequency of, for example, 13.56 MHz) is applied across the plate electrode 21 and the mesh electrode 22, plasma 23 is generated across both the electrodes 21 and 22, as illustrated in FIG. 4. If both the electrodes are flat, plasma will occur substantially in the interspace between both the electrodes. Since one electrode 22 is mesh in accordance with this invention, part of the plasma 23 leaks down through the meshes of the mesh electrode 22. Accordingly, in the case where the work piece 3 is situated under the mesh electrode 22 in a manner to be contacted by the leaking plasma, its surface is etched by the leaking plasma.

Moreover, even with the intensity of the plasma 23 generated across both the electrodes 21 and 22 is somewhat inhomogeneous, the intensity of the plasma leaking out from the interstices of the mesh electrode 22 becomes homogeneous over the whole surface.

Accordingly, the intensity of the plasma with which the work piece 3 is irradiated is homogeneous over the entire surface of the work piece 3, so that the surface of the work piece 3 is etched extraordinarily uniformly in the whole area from the central part to the peripheral edge part thereof.

Figure 1:
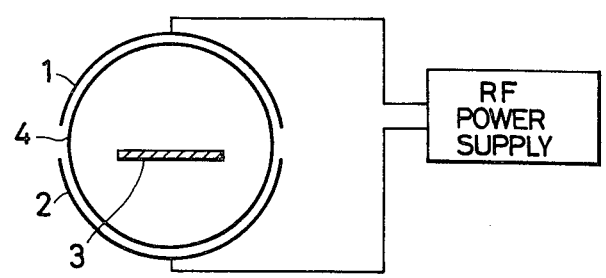
FIGS. 1 and 2 are schematic diagrams respectively showing the structures of prior art "barrel" type and "planar" type plasma-etching equipment.
Figure 2:
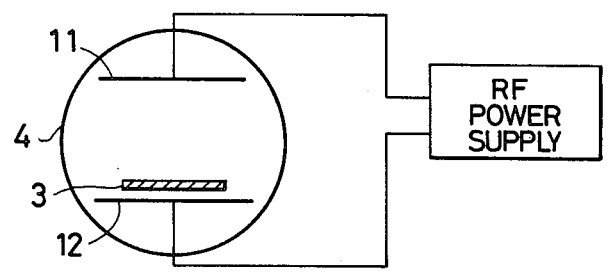
Figure 5:
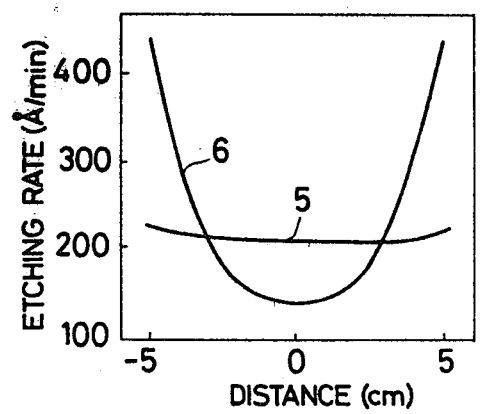
FIG. 5 is a graph showing an effect of this invention.

More specifically, curves 5 and 6 in FIG. 5 indicate the relationships between the distance from the central part of the surface of a chromium film and the etching rate of the chromium film in the case where chromium films deposited on glass substrates were subjected to plasma etching by the use of the equipment having the parallel plate electrodes according to this invention as shown in FIG. 3 and in the prior art shown in FIG. 2, respectively. As apparent from the curve 6 in FIG. 5, when the etching is performed by the prior art equipment having the parallel plate electrodes, the etching rate is much greater in the peripheral edge part than in the vicinity of the central part. It is to be understood that, with such prior art apparatus, the whole surface cannot be uniformly etched.

On the other hand, when the equipment according to this invention is used, the etching rate of the chromium film is uniform over the whole surface as illustrated by the curve 5 in FIG. 5, and it hardly increases in the peripheral edge part. Thus, it is possible, according to this invention, that the surface of a work piece in the shape of a square whose one side is about 10 cm is etched uniformly over the entire area.

In accordance with this invention, various gases such as $CF_4$, $CCl_4$, $BCl_3$, Ar, $O_2$, $N_2$, $H_2$, etc., can be employed as the gas to be introduced into the reaction tube in executing the etching, and they are appropriately selected depending upon the sort of work piece to be etched. For example, when silicon is to be etched, a mixed gas consisting of $CF_4$ and $O_2$ is favorable, and when chromium is to be etched, a mixed gas consisting of $CCl_4$ and $O_2$ is suitable. Although the pressures of these gases are, of course, different depending upon the kinds of gases employed as well as the work piece selected and the purpose of the etching, such pressures are selected from within a range of approximately 0.05–5 Torr.

The plate electrode 21 and the mesh electrode 22 are made of materials difficult to be etched by the plasma, such as aluminum and platinum. The spacing between both the electrodes can be set within a range of approximately 1–20 cm, and when it is 5–10 cm, very favorable results are obtained.

The spacing between the mesh electrode 22 and the surface of the work piece 3 is important. When this spacing is too large, the plasma leaking through the mesh cannot reach the surface of the work piece, so that the etching is impossible. When it is too small, the photoresist mesh is damaged, and besides, uniform etching is difficult. The permissible maximum value of the spacing between the mesh electrode 22 and the surface of the work piece 3 is also related to the radio-frequency power to be applied across the electrodes. For example, it is about 5 cm at radio-frequency output of 100 W; it is about 10 cm at 500 W; it is about 15 cm at 1 KW; and it is about 25 cm at 2 KW. However, when the radio-frequency output is too high, the termperature rise of the work piece becomes too great, and the photoresist film deposited on the surface of the work piece is destroyed. It is therefore difficult to perform etching through the photoresist film having a desired pattern. For this reason, ordinarily the radio-frequency power which can be applied across both the electrodes is approximately 500 W, and the maximum value of the distance between the mesh electrode and the surface of the work piece is approximately 10 cm.

On the other hand, when the distance between the mesh electrode and the surface of the work piece is too small, no uniform etching is carried out, so that the spacing between the two needs to be at least approximately 3–5 mm.

For both the electrodes, it is necessary to employ materials which are difficult to corrode by the introduced gas and the plasma, such as platinum, aluminum, stainless steel, nickel, molybdenum, titanium, chromium, and tantalum. Of course, the materials are appropriately selected depending upon the introduced gas, etc. It is also possible to use metallic electrodes covered with glass, silicon dioxide, silicon nitride, alumina or the like. When the mesh size of the mesh electrode is too small, the plasma which leaks through the mesh and with which the work piece is expose to becomes non-uniform. When it is too large, good plasma is difficult to obtain. Therefore, the mesh size of the mesh electrode (the spacing between adjacent metal wires) must be in the range of approximately 5 mm–20 mm. To the end of preventing non-uniformity in the etching, the metal wires constituting the mesh electrode is recommended to be as fine as possible.

EXAMPLE 1

A chromium film 600 Å thick and a chromium oxide ($CrO_3$) film 200 Å thick were deposited on a glass plate having a thickness of 2.4 mm. Using a hardened photoresist film as a mask, plasma etching was carried out with the equipment shown in FIG. 3. The gas introduced into the reaction tube was $CCl_4+O_2$, the pressure was 0.25 Torr, and the etching time was 11 minutes.

By such processing, both the chromium film and the chromium oxide film can be etched at a precision as high as a dimensional accuracy of $\pm 0.15$ $\mu$m. The precision in the conventional chemical etching which uses a ceric nitrate ammonium solution is usually $\pm 0.5$ $\mu$m or so. It has thus been revealed that much higher precision is achieved in accordance with this invention.

EXAMPLE 2

A chromium film 800 Å thick was deposited on a glass plate. Similar to Example 1, the chromium film was subjected to plasma etching by using a hardened photoresist film as a mask. Then, a dimensional accuracy of $\pm 0.15$ $\mu$m was attained.

EXAMPLE 3

A chromium oxide film (200 Å thick), a chromium film (600 Å thick) and a chromium oxide film (200 Å thick) were successively deposited on a glass plate. Using a hardened photoresist film as a mask, the three-layered film was subjected to plasma etching similar to Example 1. It could also be etched at a precision of $\pm 0.15$ $\mu$m.

In any of the above examples, the substrate being the work piece was an insulator. However, the etching of this invention is not restricted to such materials, but very good results can be obtained even when the invention is applied to the plasma etching of a semiconductor, such as silicon or various metals.

When the work piece is etched while moving it in the horizontal direction with, for example, an eccentric cam, non-uniformity in the etching is prevented very effectively, and still better results are obtained.

EXAMPLE 4

Using hardened photoresist films as masks, molybdenum films 1,500 Å thick were etched by the prior art equipment having the parallel plate electrodes shown in FIG. 2 and the apparatus according to this invention shown in FIG. 3. Etched end parts of both the samples were observed and compared by the use of a scanning electron microscope. Conditions during the performing of the plasma etching were made equal for both the samples. More specifically, $CF_4$ containing 4.0% of oxygen was introduced 0.5 Torr, the frequency was 13.56 MHz, the RF power was 50 W, and the etching time was 5 minutes.

As a result of employing the apparatus shown in FIG. 3, there was a very small number of ragged parts, and it was recognized that the etching was faithful to the mask pattern. In contrast, with the prior art apparatus having the parallel plate electrodes, the number of rugged parts was larger and the fidelity was lower than with the apparatus of this invention. Moreover, it was noted that unfavorable bulges appeared in the vicinities of the end parts.

The greatest feature of this invention is that a wafer of large area can be uniformly etched. Besides, there is the feature that the etching can be executed very faithfully to the mask pattern as described above. The invention is high valuable in practical use.

While we have shown and described an embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are obvious to those of ordinary skill in the art.

What is claimed is:

1. In a plasma-etching apparatus comprising a reaction tube, first and second electrodes disposed in said reaction tube, a radio-frequency power source electrically connected to said first and second electrodes and support means in the reaction tube for supporting a work piece while it is etched by plasma generated by applying radio-frequency power across said first and second electrodes, the improvement wherein said first and second electrodes consist of a metallic plate and a mesh electrode, respectively, arranged substantially in parallel and in opposition to each other, and said support means for said work piece is placed outside the space between said mesh electrode and said metallic plate, adjacent said mesh electrode and spaced therefrom.

2. A plasma-etching apparatus according to claim 1, wherein the distance between said plate electrode and said mesh electrode is approximately 1–20 cm.

3. A plasma-etching equipment according to claim 2, wherein the radio frequency power source applies a radio frequency output of about 2 KW.

4. A plasma-etching apparatus according to claim 1, wherein the spacing between said mesh electrode and the surface of said work piece is at least 3–5 mm and at most approximately 10 cm.

5. A plasma-etching apparatus according to claim 4, wherein the mesh size of said mesh electrode is approximately 5–20 mm.

6. A plasma-etching apparatus according to claim 1, 2, 4 or 5, wherein said plate electrode is made of a material selected from the group consisting of platinum, aluminum, stainless steel, nickel, molybdenum, titanium, chromium and tantalum.

7. A plasma-etching apparatus according to claim 1, 2, 4 or 5, wherein said mesh electrode is made of a material selected from the group consisting of platinum, aluminum, stainless steel, nickel, molybdenum, titanium, chromium and tantalum.

8. A plasma-etching apparatus according to claim 1, 2, 4 or 5, wherein said plate electrode is covered with a material selected from the group consisting of glass, alumina, silicon dioxide or silicon nitride.

9. A plasma-etching apparatus according to claim 1, 2, 4 or 5, wherein said mesh electrode is covered with a material selected from the group consisting of glass, alumina, silicon dioxide or silicon nitride.

10. A plasma-etching equipment according to claims 1, 2, 4 or 5, wherein said support means is capable of moving the workpiece in a horizontal direction.

* * * * *